US007876137B2

(12) United States Patent
Heightley (10) Patent No.: US 7,876,137 B2
(45) Date of Patent: Jan. 25, 2011

(54) CONFIGURABLE ARCHITECTURE HYBRID ANALOG/DIGITAL DELAY LOCKED LOOP (DLL) AND TECHNIQUE WITH FAST OPEN LOOP DIGITAL LOCKING FOR INTEGRATED CIRCUIT DEVICES

(75) Inventor: John D. Heightley, Colorado Springs, CO (US)

(73) Assignee: ProMOS Technologies PTE.Ltd., Singapore (SG)

( * ) Notice: Subject to any disclaimer, the term of this patent is extended or adjusted under 35 U.S.C. 154(b) by 0 days.

(21) Appl. No.: 12/275,179

(22) Filed: Nov. 20, 2008

(65) Prior Publication Data
US 2010/0123494 A1 May 20, 2010

(51) Int. Cl.
*H03L 7/06* (2006.01)
(52) U.S. Cl. .................................................. 327/158
(58) Field of Classification Search ................ 327/158
See application file for complete search history.

(56) References Cited

U.S. PATENT DOCUMENTS

| 6,628,154 | B2 | 9/2003 | Fiscus |
| 2004/0125905 | A1* | 7/2004 | Vlasenko et al. ............. 375/376 |
| 2008/0157836 | A1* | 7/2008 | Cho ............................ 327/158 |

* cited by examiner

*Primary Examiner*—Lincoln Donovan
*Assistant Examiner*—Daniel Rojas
(74) *Attorney, Agent, or Firm*—William J. Kubida; Peter J. Meza; Hogan Lovells US LLP (57) ABSTRACT

A configurable architecture, hybrid analog/digital delay locked loop and technique with fast open loop digital locking for integrated circuit dynamic random access memory (DRAM) devices and devices incorporating embedded DRAM. The DLL design and technique disclosed employs a hybrid analog/digital delay line, but does not use conventional closed loop architecture during the digital phase of the locking process.

19 Claims, 8 Drawing Sheets

CONFIGURABLE ARCHITECTURE HYBRID ANALOG/DIGITAL DELAY LOCKED LOOP (DLL) AND TECHNIQUE WITH FAST OPEN LOOP DIGITAL LOCKING FOR INTEGRATED CIRCUIT DEVICES

BACKGROUND OF THE INVENTION

The present invention relates, in general, to the field of integrated circuit devices. More particularly, the present invention relates to a configurable architecture, hybrid analog/digital delay locked loop and technique with fast open loop digital locking for integrated circuit dynamic random access memory (DRAM) devices and devices incorporating embedded DRAM.

Delay Locked Loops (DLLs) are used in semiconductor memory devices to align the output data with the system clock. In conventional DLL designs for memory devices, a phase detector is utilized to compare the rising edges of a buffered system clock with a feedback signal in order to adjust the delay of a variable delay line until the rising edges of the two signals are aligned. In operation, if a replica delay in the feedback path of the DLL exactly matches the sum of the input buffer and output data path delays, the output data will then be aligned with the input clock since the delay between them must be a multiple of the clock period when the DLL is locked.

In general, the variable delay lines used in DLLs fall into two broad categories. The first category is defined as a voltage controlled, or "analog", delay line and is implemented with a fixed number of individual delay elements whose delay is changed by varying a control voltage. Herein, voltage-controlled delay elements or delay lines will be referred to as analog delay elements or analog delay lines and the term analog control will mean voltage-controlled delay. The second category is defined as a digital delay line and utilizes a variable number of individual delay elements whose delay is fixed (e.g. for a given manufacturing process corner, supply voltage and temperature) and the number of delay elements is digitally varied. Herein, fixed delay elements or delay lines will be referred to as fixed or digital delay elements or digital delay lines.

In some designs, a combination of both categories of delay lines have been combined because adjusting the delay of a digital delay line tends to be faster, while the resolution of an analog delay line is finer. An example of an existing DLL design that employs a combination analog/digital delay locked loop is described in U.S. Pat. No. 6,628,154 issued on Sep. 30, 2003. In the design described, the DLL initially locks by digitally selecting the number of delay elements (or stages) in the delay chain and subsequently uses voltage control to fine tune the delay of the elements. However, the design of this particular DLL implementation employs a traditional closed loop architecture for selecting the number of delay stages and for adjusting the analog control voltage to adjust the delay per stage.

During the initial locking of the DLL, the phase comparison is made on each cycle and the number of delay stages is increased or decreased by a single stage until a "course" lock condition is achieved. Subsequently, the delay of each stage is fine-tuned using voltage control. The maximum number of stages in the delay line is determined by the lowest frequency for which the DLL must lock since, in the worst case, a full clock period of adjustment range is required. Since the digital locking is implemented in a closed loop architecture, with a comparison and a single stage adjustment being made on each clock cycle, the digital locking time can require a significant number of clock cycles. Further, since there can be a significant delay between when an adjustment is made and when the phase detector recognizes the change, due to the delay through the delay line, it is also possible to have an unstable locking condition.

SUMMARY OF THE INVENTION

Disclosed herein is a configurable architecture, hybrid analog/digital delay locked loop and technique with fast open loop digital locking for integrated circuit dynamic random access memory (DRAM) devices and devices incorporating embedded DRAM. The DLL design and technique disclosed herein employs a hybrid analog/digital delay line, but does not use a conventional closed loop architecture during the digital phase of the locking process.

In a preferred embodiment of the present invention, the first portion of the delay line has analog delay stages while the second portion of the delay line has fixed delay stages with tap outputs available at each delay stage. The appropriate tap for locking the DLL is digitally selected. A novel feature of the present invention is that the circuit blocks are configured as an open loop architecture for adjusting the number of stages (selecting the appropriate tap) in the digital portion of the delay line to achieve a locked condition, rather than the traditional closed loop architecture. In operation, the circuit blocks are re-configured as a traditional closed loop DLL architecture for the analog fine-tuning. While the hybrid delay line may also comprise all analog delay stages with taps at each stage, it may prove more difficult to achieve the same timing resolution per stage for digital locking with such a delay line design.

Particularly disclosed herein is an integrated circuit device including a analog/digital delay locked loop that may be configured as an open loop or a closed loop that comprises an input buffer to receive a clock signal. The input buffer output is connected to a single narrow edge pulse generator, a narrow reference pulse stream generator, and, selectively, to a combination analog/digital variable delay line with output taps at each stage of the digital portion thereof. Tap select logic receives the narrow reference pulse stream and the output taps from the digital portion of the delay line. The output taps are also inputs to a multiplexing circuit (MUX) whose output is, selectively, input to a replica delay line and an output data path. The output of the single narrow edge pulse generator is, selectively, connected to the input of the replica delay line and the output data path. The final tap of the digital delay line is input to an end detect latch. The output of the input buffer is further connected to the input of a phase detector whose other input is the output of the replica delay line. The output of the replica delay line is further connected to a dummy multiplexer. The output of the dummy multiplexer is connected, selectively, to the input of the delay line. Two outputs of the phase detector are inputs to a voltage control generator that provides control voltages as outputs to control the delay per stage of the analog portion of the delay line. An analog reset circuit receives one output of the end detect latch and the output of the input buffer and has its output connected to the phase detector and the control voltage generator. The term "selectively" is used herein with reference to configuration logic that selectively steers the respective signals to the denoted subsequent inputs based on the state of the end detect latch.

Also particularly disclose herein is a method for operating an analog/digital delay locked loop, that may be configured as an open loop or a closed loop, in an integrated circuit device which comprises, in the open loop configuration, supplying a clock signal to an input buffer. The input buffer is coupled to a narrow reference pulse stream generator and a narrow single edge pulse generator. The narrow edge pulse generator is coupled selectively to a replica delay line whose output is selectively coupled to the input of dummy multiplexer whose output is selectively coupled to a variable delay line comprising analog and digital portions thereof, the digital portion having output taps at each stage of delay. The single narrow pulse generated propagates down the enabled path and appears at each output tap of the digital portion of the variable delay line in turn. The narrow reference pulse stream generator is coupled to tap select logic that also receives the output taps from the digital portion. The tap select logic compares the single narrow pulse output signals appearing at the output taps in sequence to the narrow reference pulse stream and selects the output tap most closely aligned to a reference pulse, thus performing the initial digital locking. When the single narrow pulse reaches the end of the analog/digital delay line it sets an end detect latch that is initially reset, causing the delay locked loop to be re-configured as a closed loop. The analog/digital delay line also comprises, in the closed loop configuration, supplying a clock signal to an input buffer coupled selectively to the variable delay line and a phase detector. The output of the variable delay line is coupled to the replica delay line, which is coupled to the other input of the phase detector. The phase detector is coupled to a control voltage generator. The control voltage generator is coupled to the analog portion of the delay line and adjusts the delay per stage of the analog portion of the delay line in response to the signals coupled from the phase detector thus performing the analog locking.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
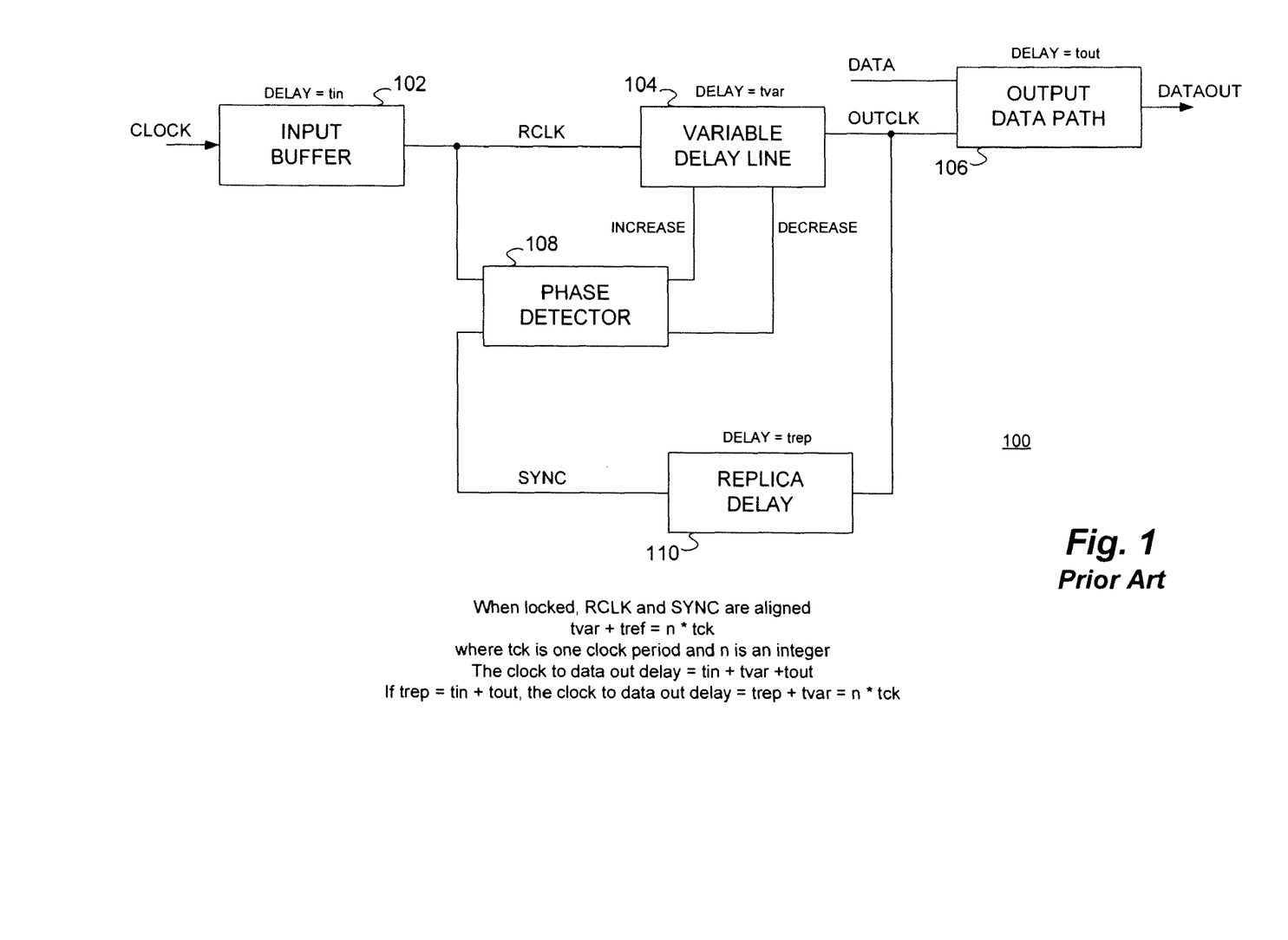
FIG. 1 is a simplified functional block diagram of a conventional prior art DLL design implemented in the form of a closed loop architecture.

With reference now to FIG. 1, a simplified functional block diagram of a conventional prior art DLL 100 design implemented in the form of a closed loop architecture is shown. The conventional DLL 100 comprises an input buffer 102 which receives a system clock signal (CLOCK) input to produce a buffered clock signal (RCLK) output and has a delay "tin". The RCLK signal is supplied as an input to a variable delay line 104 to produce an OUTCLK signal which is input to an output data path 106 in addition to a data input to provide the aligned DATAOUT signal as shown. The variable delay line 104 has a delay of "tvar" while the output data path 106 has a delay of "tout".

A phase detector 108 also receives the buffered clock signal RCLK as well as a feed back signal (SYNC) output from a replica delay block 110 which receives the OUTCLK signal as an input. The replica delay block 110 has a delay of "trep". The phase detector 108 provides an INCREASE or DECREASE signal to the variable delay line 104.

In operation, the phase detector 108 compares the rising edges of the RCLK and SYNC signals and causes the delay of the variable delay line 104 to be adjusted (increased or decreased) until the rising edges of the two signals are aligned. As shown, if the delay "trep" exactly matches the sum of the input buffer 102 and data output path 106 delays ("tin"+"tout"), the output data will be aligned with the input clock since the delay between them is a multiple of the clock period.

Figure 2A:
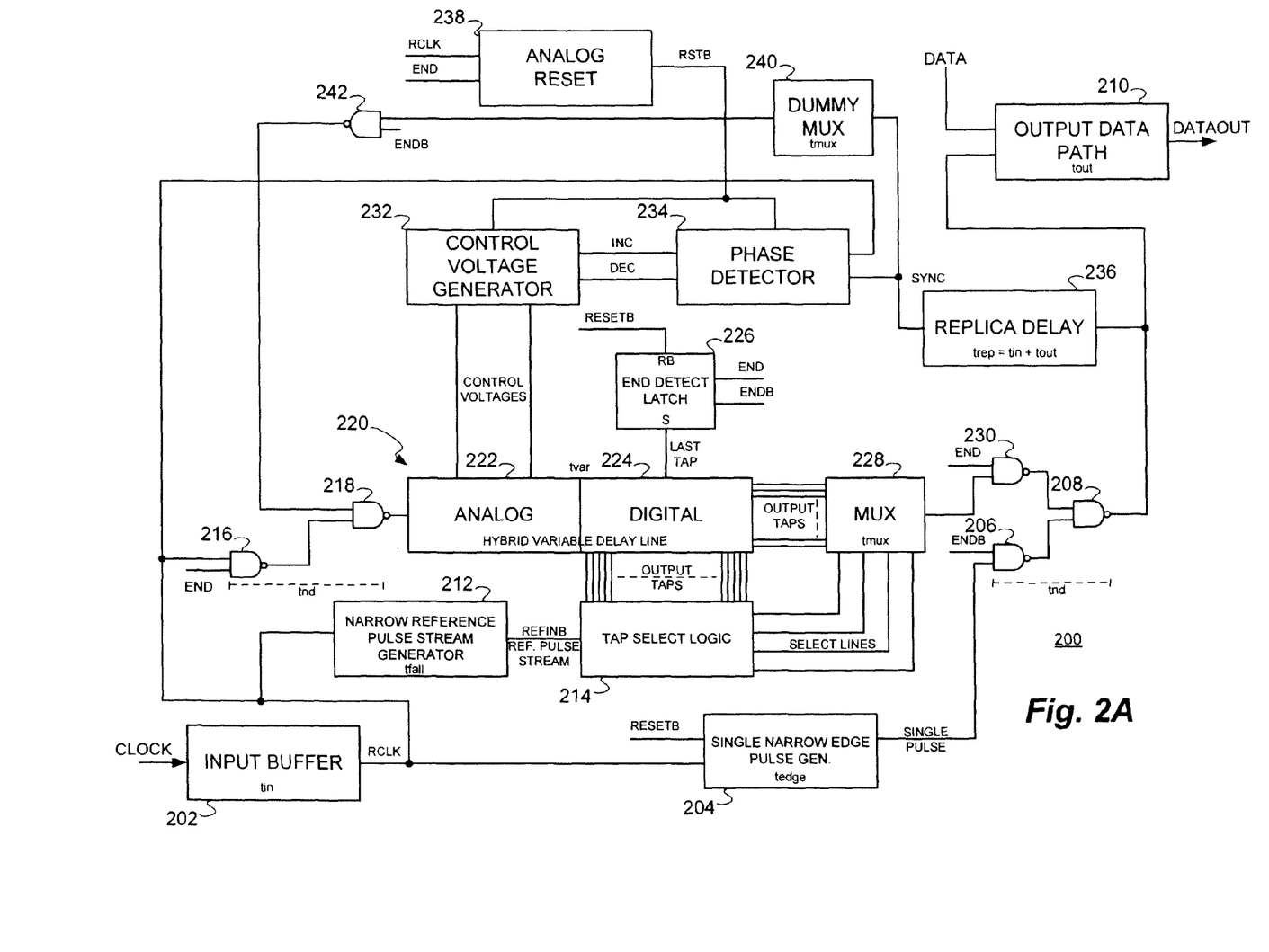
FIG. 2A is a representative embodiment of a configurable architecture, hybrid analog/digital delay locked loop with fast open loop digital locking in accordance with the present invention.
Figure 2B:
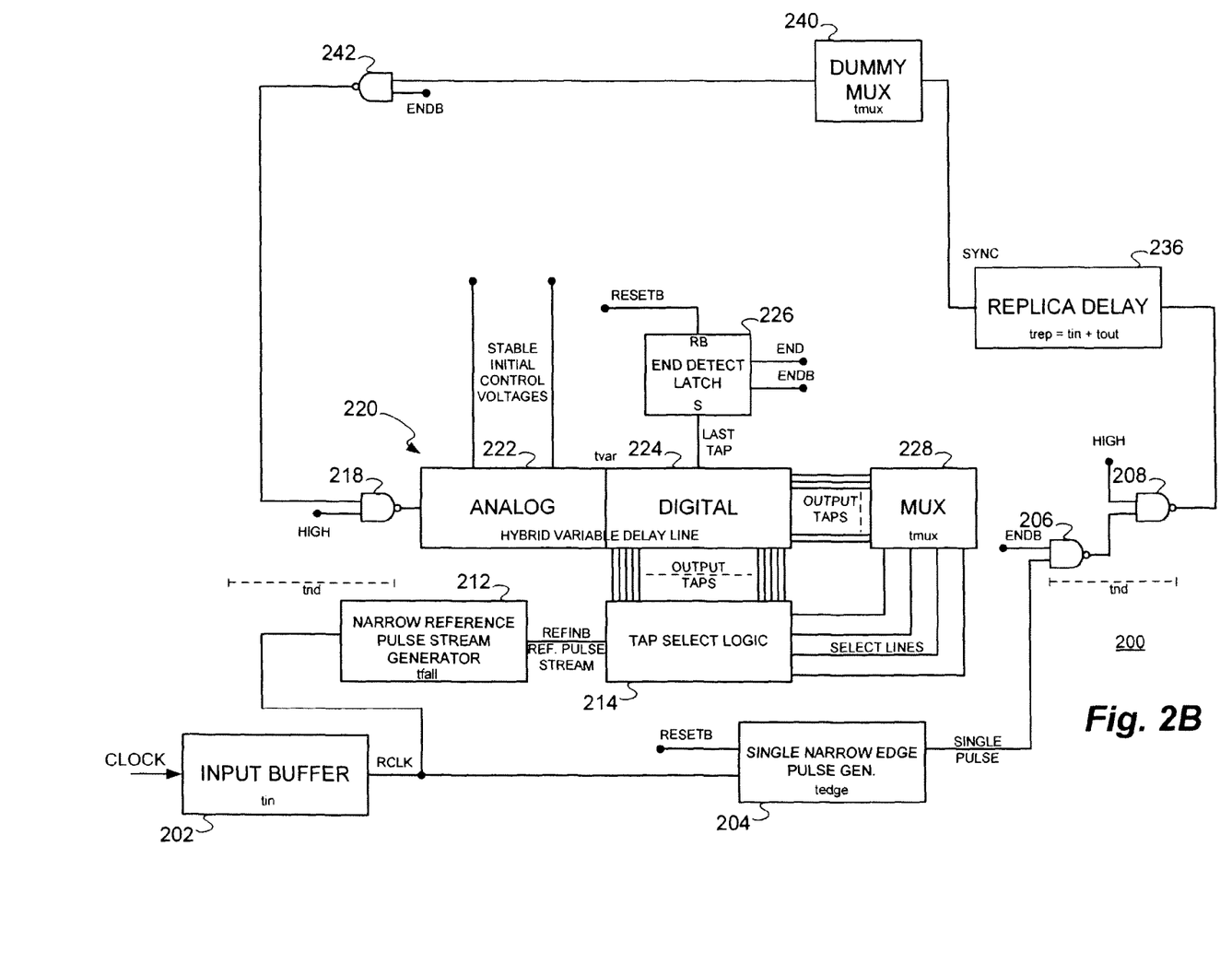
FIG. 2B is a subset of the embodiment shown in FIG. 2A showing only the circuit blocks active in the open loop configuration associated with the signal END being low.
Figure 2C:
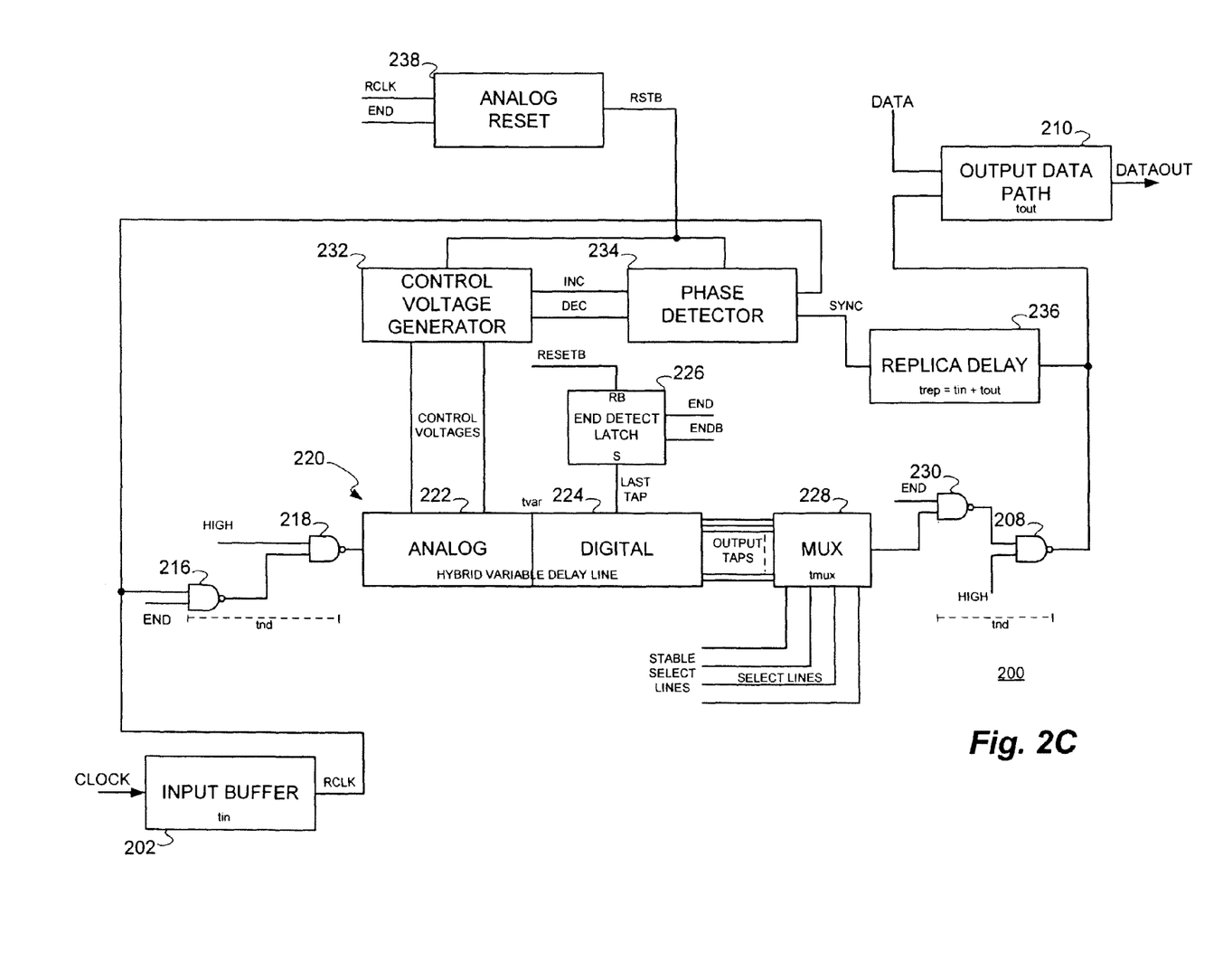
FIG. 2C is a subset of the embodiment shown in FIG. 2A showing only the circuit blocks active in the closed loop configuration associated with the signal END being high.

With reference additionally now to FIG. 2A, a representative embodiment of a configurable architecture, hybrid analog/digital delay locked loop 200 with fast open loop digital locking in accordance with the present invention is shown. In order to make the description of FIG. 2A clearer, the figure has been broken into two subsets. FIG. 2B shows the active circuits in the open loop configuration and FIG. 2C shows the active circuits in the closed loop configuration. In the following discussion with respect to FIGS. 2B and 2C, the term "high" is used to denote a logical "1" state, likewise the term "low" denotes a logical "0" state.

In operation, when the RESETB signal is "low", the configurable DLL 200 is in the reset state. The end detect latch is reset and the signal ENDB is "high" and the various circuit blocks are configured as an open loop configuration, that is, there is no feedback and the phase detector 234 is not utilized as shown in FIG. 2B. Further shown in FIG. 2B the control voltages for the analog portion of the delay line are stable at their initialized values.

Referring to the open loop configuration of FIG. 2B, the configurable DLL 200 comprises, in pertinent part, an input buffer 202 which receives a CLOCK input signal to produce a buffered clock signal (RCLK) and presenting a delay "tin".

The single narrow edge pulse generator 204 receives RCLK and input signal RESETB as inputs and has a delay "tedge". When the signal RESETB goes "high", a single narrow output pulse is generated on the next rising edge of the signal, RCLK, that provides one input to a two-input NAND gate 206 having an ENDB signal, which is high, at its other input. The output of NAND gate 206 provides one input to another two-input NAND gate 208 that has its other input high in this configuration. NAND gate 208 has its output coupled to the input of a replica delay 236 to provide the output signal SYNC. The NAND gates 206 and 208 have a combined delay of "tnd" while the replica delay has a delay of "trep=tin+tout." The output of replica delay 236 (SYNC) is connected to the input of DUMMY MUX 240 that has a delay of "tmux" and is inserted only for delay compensation. DUMMY MUX 240 has its output connected to a NAND gate 242 which has its other input connected to signal ENDB, which is high in this configuration. The output of NAND gate 242 is connected to one input of another NAND gate 218 that has its other input high in this configuration. The NAND gates 242 and 218 have a combined delay of "tnd". The output of NAND gate 218 is connected to the input of hybrid variable delay line 220 having a delay from its input to the output of the selected tap of "tvar" and comprising an analog portion 222 and a digital portion 224. The digital portion of the hybrid variable delay line has multiple output taps with one tap at each stage of the digital delay line. The multiple output taps are connected to the tap select logic 214 and the MUX 228. The last tap of the digital delay line is connected to the end detect latch. The single narrow pulse that has been generated propagates through the enabled path described above until it reaches the end tap of the digital delay line and sets the end detect latch.

The buffered RCLK signal is also an input to a narrow reference pulse stream generator 212 which has a delay from the rising edge of RCLK to the falling edge of the narrow pulses of "tfall". The narrow reference pulse stream output of the pulse stream generator 212 (REFINB) is input to tap select logic 214. The single narrow pulse propagating down the delay line 220, as described above, appears in sequence at the tap output of each stage of the delay line 220.

As the narrow pulse arrives at each stage of the delay line it is compared to the stream of narrow reference pulses (REFINB) at the output of the reference pulse stream generator 212 as the single pulse propagates through the line.

When the single pulse propagating from tap to tap through the line overlaps one of the reference stream of pulses sufficiently, a latch is set in the tap select logic stage where the overlap has occurred. The tap select logic 214 associated with the hybrid variable delay line 220 examines the latched information in adjacent stages to determine which tap will be selected as the locked output of the delay line. The tap select logic has multiple select line outputs that are connected to multiplexer MUX 228. A single select line will be enabled based on the state of the latched information as will be more fully described below. After the single pulse has propagated through all stages of the digital portion 224 of the hybrid variable delay line 220, the end detection latch 226 is set causing signal END to go high and signal ENDB to go low. The configurable DLL 200 is thus reconfigured as a closed loop architecture, as shown in FIG. 2C.

At this point, the fine-tuning of delay is done by voltage control of the stage delays of the analog portion of the hybrid delay line in the conventional manner. Since the delay of the hybrid variable delay line 220 only has to be equal to one clock period of the lowest frequency of operation and the digital locking is completed in this period of time, the initial digital locking time will be very short, in contrast to closed loop digital locking.

Referring now to the closed loop configuration of FIG. 2C, the configurable DLL 200 comprises in pertinent part, an input buffer 202 which receives CLOCK input signal to produce a buffered clock signal (RCLK) and presenting a delay "tin". The RCLK signal is provided at one input of a two-input NAND gate 216 which has its other input coupled to receive an END signal which is high in the closed loop configuration. Output of the NAND gate 216 is provided as input to another two-input NAND gate 218 that has its other input high in this configuration. The output of NAND 218 is coupled to the hybrid variable delay line 220 comprising an analog portion 222 and a digital portion 224. The NAND gates 216 and 218 have a collective delay of "tnd" while the hybrid variable delay line 220 has a delay of "tvar" as previously defined. A multiplexer (MUX) 228 is coupled to the output taps of the digital portion 224 of the hybrid variable delay line 220 and receives a number of select inputs from the tap select logic 214. As described with reference to FIG. 2B, as a result of the digital locking phase, the tap select logic 214 enables only one of the multiple select lines thus selecting a single output tap of the digital portion 224 of the hybrid variable delay line 220. The multiplexer 228 has a delay of "tmux" and provides the selected tap signal to one input of a two-input NAND gate 230 which receives the END input signal, which is high, as its other input as shown. Output of the NAND gate 230 is supplied to one input to NAND gate 208 whose other input is high in this configuration. The output of NAND 208 is provided as input to the output data path 210 with the data input and the replica delay block 236 whose delays are "tout" and "trep=tin+tout" respectively. The output of the replica delay block 236 (SYNC) is coupled to one input of the phase detector 234 and RCLK is provided as the second input to the phase detector.

The phase detector 234 then provides increase (INC) and decrease (DEC) control signals to a voltage control generator 232. The voltage control generator 232 provides control voltages to the analog portion 222 of the hybrid variable delay line 220 to adjust the delay of the individual analog stages. The closed loop configuration allows fine adjustments to the delay of the variable delay line in the conventional manner. It will be recognized that the closed loop configuration of FIG. 2C is the same as the prior art configuration of FIG. 1 except for the configuration selection logic (NAND gates 216, 218, 230, and 208) the end detect latch and the analog reset which will be described later.

Figure 3:
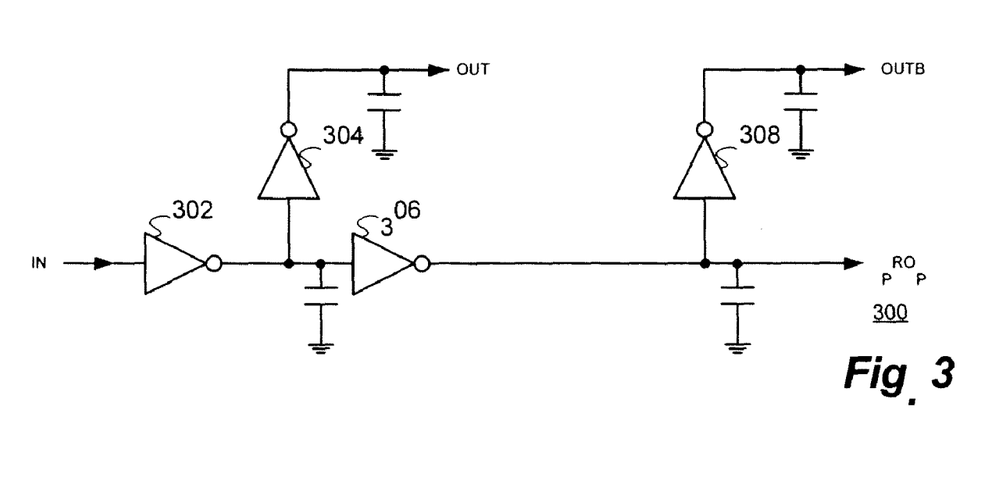
FIG. 3 illustrates a single stage delay element of the digital portion of the hybrid delay line of the preceding figures.

With reference additionally now to FIG. 3, a single stage delay element 300 of the digital portion of the hybrid delay line of the preceding figures is shown. The delay element 300 comprises a first inverter 302 which receives the IN signal at its input and provides an inverted signal at its output which is again inverted through inverter 304 to produce the output signal OUT as shown. The output of inverter 302 is also inverted through inverter 306 to produce the PROP signal. The PROP signal is further inverted through inverter 308 to provide the complementary output signal OUTB. Parasitic capacitance is indicated between the various signal lines and circuit ground. The output signals OUT and OUTB are collectively referred to as "output taps" in FIG. 2A With reference additionally now to FIGS. 4A through 4H, an eight-stage block of the digital portion of the delay line of FIG. 2A, including the tap selection logic, is shown. Note that the nomenclature for multiple signals of the same function in FIGS. 4A-H are represented as SIGNAL<A:B>, e.g., LAT<0:7> means there are 8 signals LAT<0> through LAT<7>. The logic gates and circuit blocks shown in FIGS. 4A-H may represent multiple instances of such logic gates or circuit blocks, one for each of the multiple inputs so defined, e.g., NAND gate 412 actually represents 8 NAND gates.

Figures 4A, 4B, 4C, 4D, 4E, 4F, 4G, 4H:
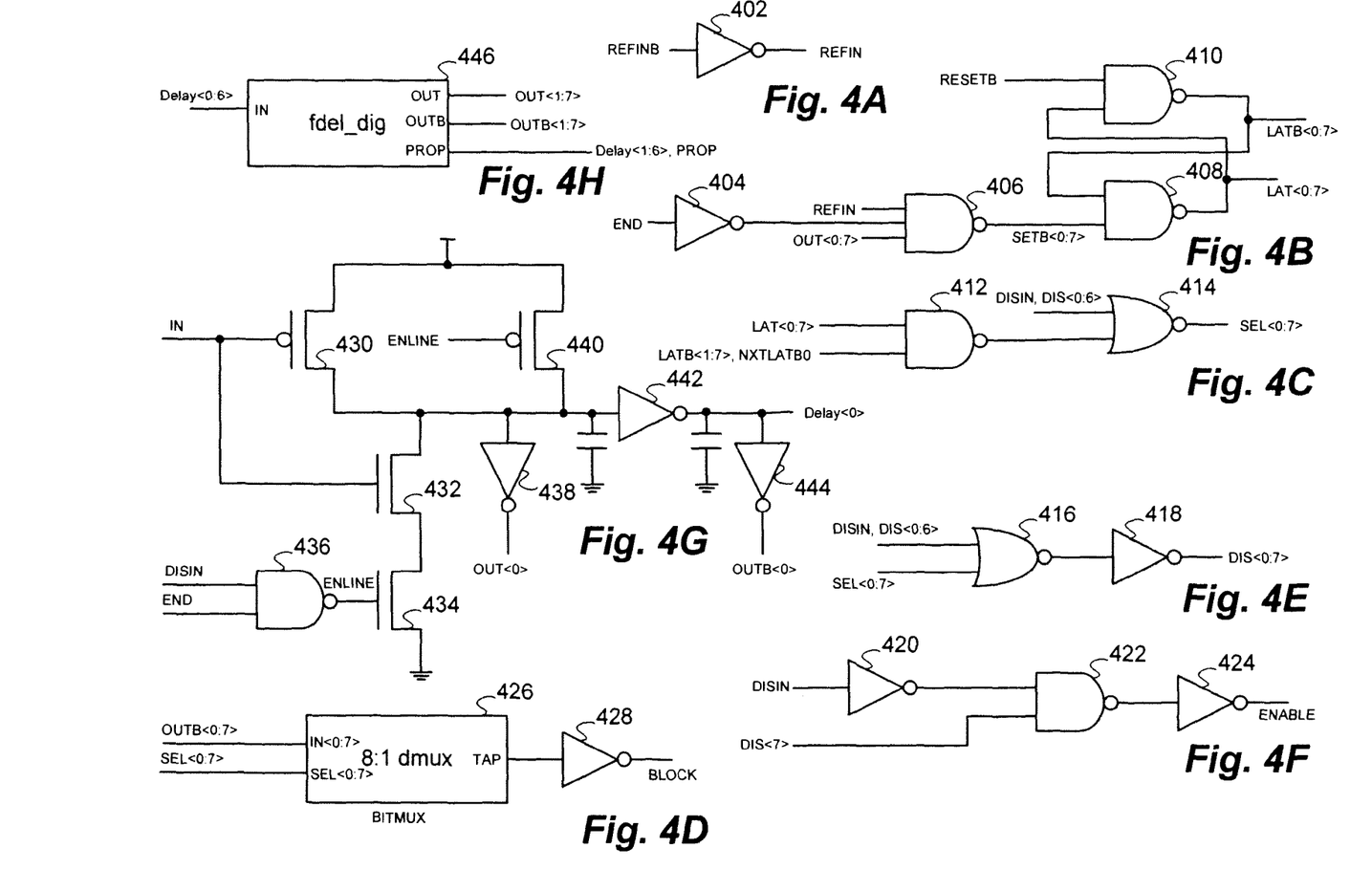
FIGS. 4A-H illustrate an eight-stage block of the digital portion of the delay line of FIG. 2A, including the tap selection logic.

With particular reference to FIG. 4A, the REFINB signal is applied to inverter 402 to provide the complementary signal REFIN.

Referring additionally to FIG. 4B, the END signal is inverted through inverter 404 and applied to one input of each of the eight three-input NAND gates 406, with the REFIN signal and OUT<0:7> being applied to each of the other two inputs respectively. The outputs of NAND gates 406 are the SETB<0:7> signals which are applied to one input of each of the eight two-input NAND gates 408. The output of NAND gates 408 are the LAT<0:7> signals which are one input of each of eight other two-input NAND gates 410, respectively which have the RESETB signal at their other input. The outputs of NAND gates 410 are the LATB<0:7> signals which are supplied to the remaining input of each of the eight NAND gates 408 respectively. NAND gates 408 and 410 form eight latches that are set when the respective signals SETB<0:7> go low and are reset when signal RESETB is low.

In FIG. 4C, it can be seen that the LAT<0:7> and LATB<1:7>, NXTLATB0 signals are supplied to the inputs of the eight two-input NAND gates 412, the outputs of which are supplied as one input respectively to the eight two-input NOR gates 414. Signal NXTLATB0 is signal LATB<0> from the first stage of the next eight-stage block if blocks are cascaded otherwise it is "high". The remaining inputs of the eight NOR gates 414 receive the DISIN, DIS<0:6> signals to provide SEL<0:7> output signals. As shown in FIG. 4D, the SEL<0:7> signals are supplied to the SEL<0:7> inputs of an 8:1 multiplexer 426 in addition to the OUTB<0:7> signals at it's IN<0:7> inputs. The TAP output of the multiplexer 426 (BITMUX) is inverted by means of inverter 428 to produce a BLOCK signal at its output.

With particular reference to FIG. 4E, the DISIN, DIS<0:6> signals input to one input of each of the eight two-input NOR gates 416 respectively while the SEL<0:7> outputs of NOR gates 414 are supplied to their other input respectively. Outputs of NOR gates 416 are inverted through inverters 418 to provide DIS<0:7> signals. In FIG. 4F, the DISIN signal which is the DIS<7> signal from a lower order eight stage block (tied "low" for the first block in the line) is inverted through inverter 420 and supplied to one input of two-input NAND gate 422. The DIS<7> signal from the current block is supplied to its other input. Outputs of NAND gate 422 are inverted through inverters 424 to produce an ENABLE signal as shown.

In FIG. 4G, the first stage of the eight-stage block of the digital delay portion of the hybrid variable delay line is shown. This first stage has identical delay to the subsequent stages, but includes logic for disabling the propagation of its input signal. The IN signal is supplied to the common connected gates of P-channel transistor 430 and series connected N-channel transistor 432. An additional N-channel transistor 434 couples the series connected transistors 430 and 432 to a reference voltage. The gate of transistor 434 is driven by an ENLINE signal at the output of two-input NAND gate 436 which has the DISIN and END signals at its inputs. The ENLINE signal is also supplied to the gate terminal of P-channel transistor 440 which is connected in parallel with transistor 430 between a supply voltage source and a node defined by the common connected drains of transistors 430 and 432. The signal on this node is inverted by inverter 438 to provide the OUT<0> signal and by inverter 442 to provide a Delay<0> signal. The Delay<0> signal is further inverted by inverter 444 to provide the OUTB<0> signal. Parasitic capacitance is again indicated between the various signal lines and circuit ground.

Referring to FIG. 4H, the final seven stages 446 of an eight stage block of the digital delay portion of the hybrid variable delay line 220 of FIG. 2A is shown comprising seven of the single stage delay elements 300 of FIG. 3. As shown, the first stage of this section 446 (second stage of the eight-stage block) of the digital delay portion of the hybrid delay line receives a Delay<0> signal from the first stage of the eight-stage block (FIG. 4G) at its first IN input. The input of the second stage of this section then receives its input from the output of the first stage of this section labeled as Delay<1> and so on, thus cascading seven delay stages. The final stage output is labeled PROP and is available for cascading additional eight stage delay blocks. The seven stage digital delay section provides the tap outputs at each of the seven stages as signals OUT<1:7>, OUTB<1:7> respectively.

The following description of the operation of the tap select logic may be understood in conjunction with FIG. 4A through FIG. 4H.

As previously described, FIGS. 4A through 4H collectively illustrate an eight-stage block of the digital portion of the hybrid variable delay line 220, including the tap selection logic 204 (FIG. 2A). The first stage of the eight stage block is disabled after the digital locking has been completed i.e., the END signal goes "high", if a tap selection has been made in a lower order block (DISIN is "high"). This functions to conserve power since no block beyond the selected block will be undergoing any switching.

Also as previously described, the narrow reference pulse stream signal REFINB is inverted and REFIN is utilized as the internal reference signal. When the END signal is "low" (and the complementary signal ENDB is "high"), a single narrow pulse is propagated through the delay line as previously described. When the signal END is "low", the REFIN signal is compared with the single narrow pulse as it arrives at each tap of the delay line, OUT<0:7> (by NAND gates 406). If the two pulses overlap for a sufficiently long period, for example at the nth tap, the signal SETB<n> goes "low", the nth latch is set and the signal LAT<n> goes "high". For each stage <n> the signal LAT<n> is compared with the signal LATB<n+1> (LATB of the subsequent stage) by NAND gates, 412. If LAT<n> is "high", LATB<n+1> is "high", and DIS<n−1> (DIS of the previous stage) is "low", SEL<n> goes "high" and the signal OUTB<n> is passed to the output, BLOCK, by the multiplexer 426.

If SEL<n> goes high, DIS<n> will go high and all subsequent DIS signals will go high (FIG. 4E) thus assuring that once a lower order tap has been selected, all higher order taps are deselected. This assures that only a single stage tap will be selected. If DISIN is low (No tap has been selected in any lower order block) and DIS<7> is high (a tap has been selected in the current block) the signal ENABLE will go high (FIG. 4F). The signal ENABLE is provided as an output to a higher order multiplexer that multiplexes the outputs from blocks similar to the example illustrated in these figures in order for the length of the digital delay line to be extended beyond eight stages.

Figure 5:
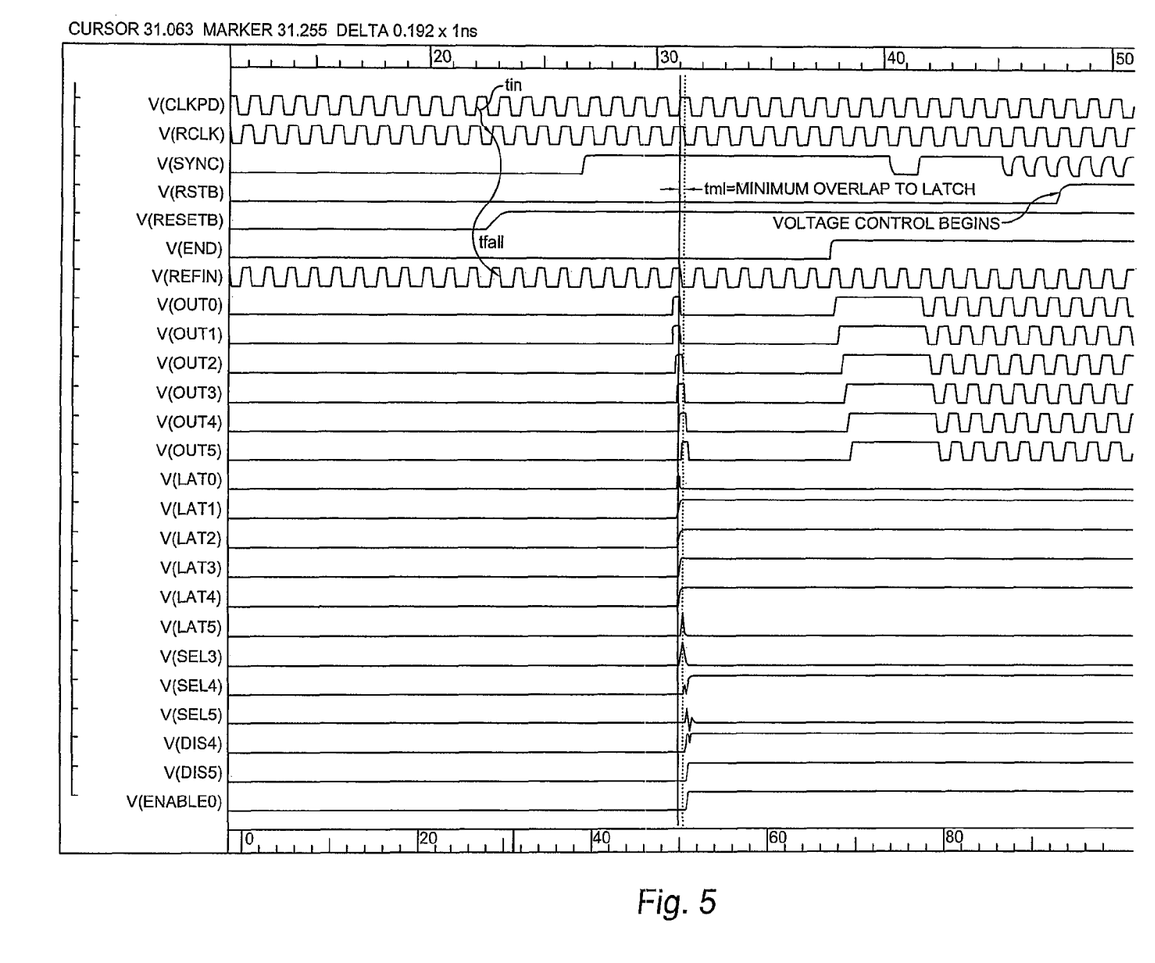
FIG. 5 is a series of waveforms comprising a simulation of the operation of a configurable architecture, hybrid analog/digital delay locked loop in accordance with the present invention with a clock period of 1.0 nsec showing, for example, the selection of tap4 in block0 of a sixty-four-stage (eight block) digital portion of the hybrid delay line.

With reference additionally now to FIG. 5, a series of waveforms comprising a simulation of the operation of a configurable architecture, hybrid analog/digital delay locked loop in accordance with the present invention is shown.

The illustrated simulation utilizes a clock period of 1.0 nsec and shows the selection of tap4 in eight-stage block0 of a sixty-four-stage (eight blocks) delay line. Four adjacent latches are set (1-4), however, latch 4 is set (LAT4 is high) and latch 5 is not (LAT5 is low so LATB5 is high), which is the relationship required for selecting tap4 as previously described. The selection signal sel4 thus goes "high" in the steady state while all other selection ("sel") signals are "low". Thus the 8:1 multiplexer steers the signal outb4 from tap 4 to the BLOCK output as seen in FIG. 4D. Further, the signal dis4 goes "high" which causes signal dis5 and every other subsequent disable ("dis") signal in the line to go "high" disabling selection of the higher order stages. The signal enable0 also goes "high" indicating that block0 is to be selected by the higher order multiplexer.

In conjunction with the various delay times defined and shown in this figure, the delay times associated with various functional blocks of an embodiment of a configurable DLL in accordance with the present invention are as previously disclosed with respect to FIGS. 2A, 2B, and 2C. In operation, the overall locking sequence is as follows: a) perform the open loop digital locking, which is completed when the signal END goes "high"; b) perform the closed loop analog fine-tuning; and c) continue to maintain the lock via the analog fine-tuning.

After the signal RESETB goes "high" and END is still "low", the configurable DLL 200 is in the open loop configuration. From FIG. 2B, it can be determined that the delay between the CLOCK input and the rising edge of the single pulse that has been generated and propagated through the delay line to the selected tap output is:

$$\text{delay} = t_{in} + t_{edge} + t_{nd} + t_{rep} + t_{mux} + t_{nd} + t_{var} \quad \text{Equation 1}$$

From the simulation of FIG. 5, it is seen that this delay is also equal to:

$$\text{delay} = t_{in} + t_{fall} + x \cdot t_{ck} - t_{ml} \quad \text{Equation 2}$$

where tml is the time between the rising edge of the tap output of the last stage to have it's latch set and the falling edge of the reference signal REFIN. The multiplier "x" is the number of clock periods between the first falling edge of the signal REFIN after RESETB has gone "high" and the falling edge of the REFIN pulse that overlaps the selected tap output. In the simulation of FIG. 5, x=8.

When the single pulse has propagated through the line, the digital locking is completed and the signal END goes "high". The DLL is then in the closed loop configuration and the fine-tuning begins. At this time, as seen in FIG. 2C, the delay between RCLK and SYNC when the fine-tuning of the locking is completed and the rising edges of SYNC and RCLK are aligned is:

$$\text{delay (RCLK-SYNC)} = t_{nd} + t_{var} + t_{mux} + t_{nd} + t_{rep} = n \cdot t_{ck} \quad \text{Equation 3}$$

It can also be seen that the delay between the input CLOCK and DATAOUT is:

$$\text{delay (CLOCK-DATAOUT)} = t_{in} + t_{nd} + t_{var} + t_{mux} + t_{nd} + t_{out} \quad \text{Equation 4}$$

If trep=tin+tout and the terms are reordered in Equation 4, $$\text{delay (CLOCK-DATAOUT)} = t_{nd} + t_{rep} + t_{mux} + t_{var} + t_{nd} \quad \text{Equation 5}$$

The goal of the DLL is to make this delay a multiple of the clock period, tck, so that the rising edges of the two signals are aligned. Comparing Equation 3 and Equation 5 shows this condition is met when the closed loop DLL is locked and fine-tuned and trep=tin+tout.

From Equation 1 and Equation 2, (which are equal), it follows that:

$$t_{nd} + t_{rep} + t_{mux} + t_{var} + t_{nd} = x \cdot t_{ck} + t_{fall} - t_{ml} - t_{edge} \quad \text{Equation 6}$$

Comparing Equation 5 (the final locked delay) and Equation 6 (the delay after the open loop locking) shows that the analog delay line only has to adjust the delay by (tfall−tml−tedge) after the digital locking is completed to achieve the final locked condition. This error can be made very small by properly setting the individual elements of the delay.

Referring again to FIG. 5, the signal END is shown going "high" which begins the transition to the closed loop DLL. There is a period of time required for all of the signals in the lines to clear out before the analog locking can begin. When END goes "high", it initiates a timer in the analog reset block 238 (FIG. 2A) and the signal RSTB keeps the voltage control circuitry in a reset condition until the required time has passed. In the simulation of FIG. 5, this time is approximately 10.0 nsec.

Figure 6:
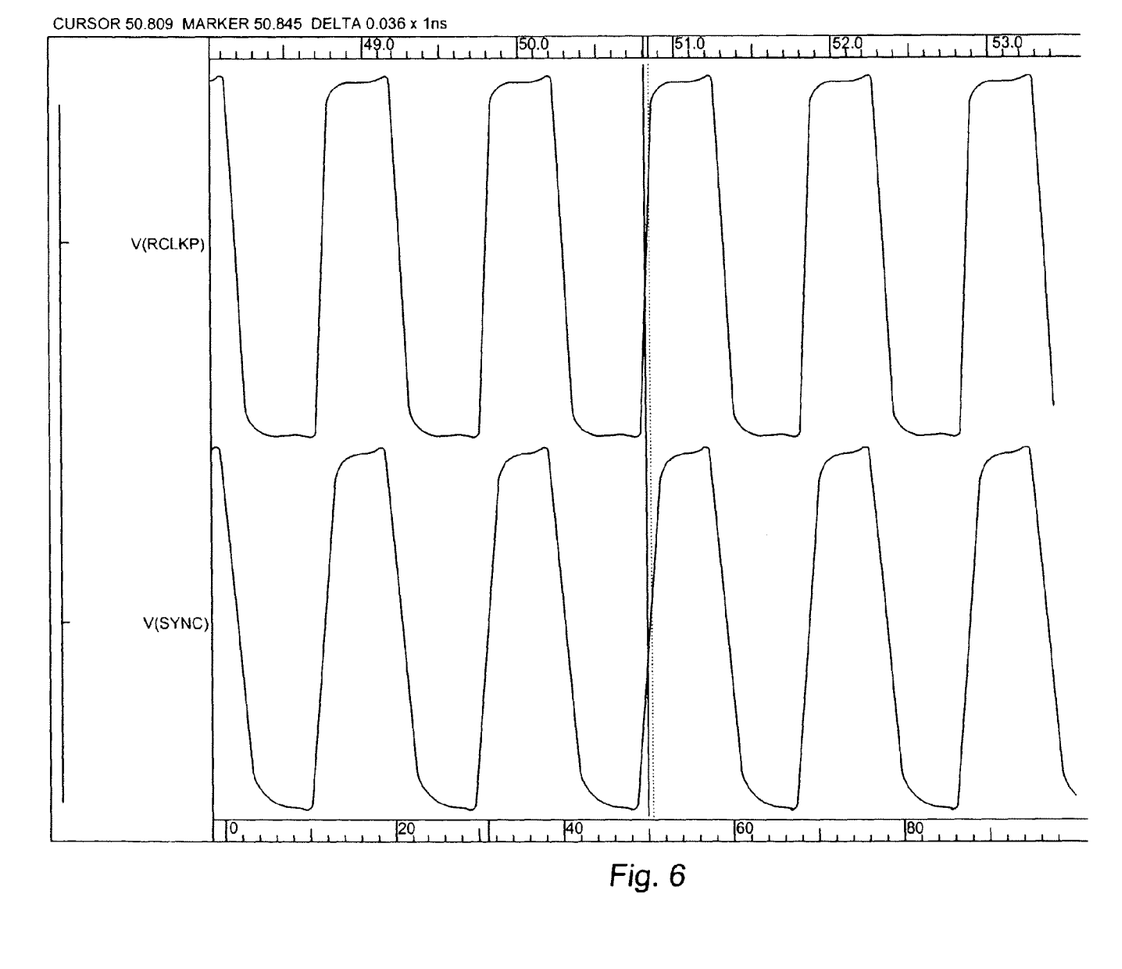
FIG. 6 is a further series of waveforms illustrating the relationship between the RCLK and SYNC signals after the digital locking has terminated and before the analog delay adjustment begins.

With reference additionally now to FIG. 6, a further series of waveforms is shown illustrating the relationship between the RCLK and SYNC signals after the digital locking has terminated and before the analog delay adjustment begins. The error is substantially 36.0 psec. in this case which, for the particular process corner, supply voltage, and temperature used in the simulation, is all that the analog fine-tuning has to adjust for.

While there have been described above the principles of the present invention in conjunction with specific circuitry it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device including a digital delay circuit comprising:
   an input buffer coupled to receive a clock signal;
   a phase detector coupled to an output of said input buffer;
   a replica delay block coupled to said phase detector and an output data path;
   a variable delay line outputting a feedback signal to the phase detector and coupled to said input buffer, said phase detector and said output data path, said variable delay line comprising analog and digital portions thereof, said analog portion comprising a number of analog delay stages and said digital portion comprising a plurality of fixed delay stages;

open and closed loop configuration selection logic wherein in the open loop configuration the variable delay line is controlled without the use of the feedback signal and in the closed loop configuration the variable delay line is controlled by the feedback signal such that the digital delay circuit functions as a delay locked loop; and an end detection latch coupled to said digital portion of said variable delay line and said configuration selection logic.

2. The integrated circuit device of claim 1 wherein said digital portion of said variable delay line comprises one tap output at each of said plurality of fixed delay stages.

3. The integrated circuit device of claim 2 wherein said one tap output at each of said plurality of fixed delay stages of said variable delay line is digitally selected.

4. The integrated circuit device of claim 3 further comprising:
tap selection logic associated with said taps of said digital portion of said variable delay line.

5. The integrated circuit device of claim 4 further comprising:
a reference pulse stream generator coupled to said input buffer and said tap selection logic.

6. The integrated circuit device of claim 5 further comprising:
comparison logic and a latch at each said tap receiving said tap output and said reference pulse stream for said tap selection.

7. The integrated circuit device of claim 6 further comprising:
a multiplexer coupled to said taps of said digital portion of said variable delay line and said output data path.

8. The integrated circuit device of claim 1 further comprising:
a single edge pulse generator coupled to said input buffer for selectively applying an output to said replica delay block and said output data path.

9. The integrated circuit device of claim 1 further comprising:
a control voltage generator coupled to said phase detector and said analog portion of said variable delay line.

10. A method for operating a digital delay devise in an integrated circuit device comprising:
supplying a clock signal to an input buffer;
coupling a phase detector to an output of said input buffer;
coupling a replica delay block to said phase detector and an output data path wherein the variable delay line outputs a feedback signal to the phase detector;
coupling a variable delay line to said input buffer, said phase detector and said output data path, said variable delay line comprising analog and digital portions thereof;
controlling said analog portion of said variable delay line with voltage control signals;
adjusting a delay of said digital portion of said variable delay line with digital logic control signals;
configuring said delay locked loop as an open loop for adjusting a delay of said digital portion of said variable delay line and as a closed loop for adjusting a delay of said analog portion of said delay line; and
controlling a configuration of said delay locked loop with an end detect latch that is initially reset to establish said open loop configuration and set to establish said closed loop configuration at the end of said adjusting of said delay of said digital portion of said delay line, wherein in the open loop configuration the variable delay line is controlled without the use of the feedback signal and in the closed loop configuration the variable delay line is controlled by the feedback signal such that the digital delay circuit functions as a delay locked loop.

11. The method of claim 10 further comprising:
providing at least one tap output at each stage of said digital portion of said variable delay line.

12. The method of claim 11 further comprising:
digitally selecting said one tap output at one stage of said digital portion of said variable delay line.

13. The method of claim 10 further comprising:
associating tap selection logic with taps of said digital portion of said variable delay line.

14. The method of claim 13 further comprising:
coupling a reference pulse stream generator to said input buffer and said tap selection logic.

15. The method of claim 13 further comprising: comparing said tap output signals with said reference pulse stream and selecting said one tap at a single stage of said digital delay line.

16. The method of claim 10 further comprising:
coupling a multiplexer to said taps of said digital portion of said variable delay line and said output data path.

17. The method of claim 10 further comprising:
coupling a single edge pulse generator to said input buffer and selectively coupling said single edge pulse generator to said replica delay block and said output data path.

18. The method of claim 10 further comprising:
furnishing control voltages to said analog portion of said variable delay line utilizing a control voltage generator coupled to said phase detector.

19. The method of claim 10 further comprising:
detecting a last tap of said digital portion of said variable delay line utilizing an end detection latch.

* * * * *

UNITED STATES PATENT AND TRADEMARK OFFICE
CERTIFICATE OF CORRECTION

| | | |
|---|---|---|
| PATENT NO. | : 7,876,137 B2 | Page 1 of 1 |
| APPLICATION NO. | : 12/275179 | |
| DATED | : January 25, 2011 | |
| INVENTOR(S) | : John D. Heightley | |

It is certified that error appears in the above-identified patent and that said Letters Patent is hereby corrected as shown below:

IN THE CLAIMS:

Column 11, claim 10 line 44, "devise" should be --device--

Signed and Sealed this
Tenth Day of May, 2011

David J. Kappos
*Director of the United States Patent and Trademark Office*